(12) United States Patent
Kawai et al.

(10) Patent No.: US 9,105,558 B2
(45) Date of Patent: Aug. 11, 2015

(54) SILICON CARBIDE SEMICONDUCTOR DEVICE AND MANUFACTURING METHOD OF THE SAME

(71) Applicant: DENSO CORPORATION, Kariya, Aichi-pref. (JP)

(72) Inventors: Jun Kawai, Anjo (JP); Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/197,542

(22) Filed: Mar. 5, 2014

(65) Prior Publication Data

US 2014/0299886 A1    Oct. 9, 2014

(30) Foreign Application Priority Data

Apr. 8, 2013    (JP) .................................. 2013-80433

(51) Int. Cl.
 *H01L 29/15* (2006.01)
 *H01L 29/16* (2006.01)
 *H01L 21/02* (2006.01)
(52) U.S. Cl.
 CPC ...... *H01L 29/1608* (2013.01); *H01L 21/02529* (2013.01)
(58) Field of Classification Search
 CPC ..................... H01L 21/02378; H01L 21/02447
 USPC ........................................... 257/77, E21.054
 See application file for complete search history.

(56) References Cited

U.S. PATENT DOCUMENTS

| 5,354,696 A | 10/1994 | Oostra et al. |
| 2007/0045631 A1 | 3/2007 | Endo et al. |
| 2007/0066039 A1 | 3/2007 | Agarwal et al. |
| 2008/0283845 A1 | 11/2008 | Endo et al. |
| 2010/0006848 A1* | 1/2010 | Fukuoka et al. ................. 257/66 |
| 2011/0092063 A1* | 4/2011 | Kawai et al. ................... 438/602 |
| 2011/0263084 A1* | 10/2011 | Yamazaki ..................... 438/161 |
| 2012/0003795 A1 | 1/2012 | Noda |
| 2012/0146134 A1 | 6/2012 | Kamada |

FOREIGN PATENT DOCUMENTS

| JP | 2002-289550 A | 10/2002 |
| JP | 2004-022878 A | 1/2004 |
| JP | 2008-135611 A | 6/2008 |

OTHER PUBLICATIONS

Office Action mailed May 12, 2015 issued in corresponding JP patent application No. 2013-080433 (and English translation).

* cited by examiner

*Primary Examiner* — Brook Kebede
(74) *Attorney, Agent, or Firm* — Posz Law Group, PLC

(57) ABSTRACT

A silicon carbide semiconductor device includes: a semiconductor substrate made of silicon carbide single crystal and having a principal surface and a backside; and an ohmic electrode contacting one of the principal surface and the backside of the semiconductor substrate in an ohmic manner. A boundary between the ohmic electrode and the one of the principal surface and the backside of the semiconductor substrate is terminated with an element, which has a Pauling electronegativity larger than silicon and a binding energy with silicon larger than a binding energy of Si—H.

7 Claims, 8 Drawing Sheets

SILICON CARBIDE SEMICONDUCTOR DEVICE AND MANUFACTURING METHOD OF THE SAME

CROSS REFERENCE TO RELATED APPLICATION

This application is based on Japanese Patent Application No. 2013-80433 filed on Apr. 8, 2013. the disclosure of which is incorporated herein by reference.

TECHNICAL FIELD

The present disclosure relates to a silicon carbide semiconductor device having an ohmic electrode, and a manufacturing method of the same.

BACKGROUND

Conventionally, it is required to form an ohmic electrode as a drain electrode, for example, in a vertical power device having a silicon carbide substrate (i.e., SIC substrate). The ohmic electrode connects the power device and an electric circuit such that a contact resistance between the SIC substrate and the ohmic electrode such as the drain electrode is reduced.

A method for forming the ohmic electrode is such that an impurity doped layer is formed by an ion implantation process, and the impurity is activated. In this case, a backside electrode is formed by a following process. First, an electrode is formed on a front surface of the SIC substrate having a vertical semiconductor device. Then, a resin film is formed to cover the surface of the SiC substrate, and a thin film is formed on the backside of the SiC substrate. An impurity is implanted on the backside of the SIC substrate. Then, a laser beam is irradiated on the backside of the SIC substrate. After that, a metal film is formed on the backside of the SIC substrate, so that the electrode is formed on the backside.

However, it is necessary to anneal the substrate for a long time in the ion implantation process. Further, the ion implantation apparatus is expensive, and further, the cost of an ion implantation process is very high. Accordingly, it is required to form the ohmic electrode without performing the ion implantation process.

It is considered as a method for forming the ohmic electrode without performing the ion implantation process that a metal film is formed on the SiC substrate, and a laser beam is irradiated on the SIC substrate. In this case, the backside electrode is formed by a following process. First, the backside of the SIC substrate is ground so that a convexity and concavity is formed on the backside with a surface roughness (i.e., Ra) equal to or larger than 10 nanometers and equal to or smaller than 500 nanometers. Then, the metal film is formed on the backside of the substrate. After that, the laser beam is irradiated on the backside of the SIC substrate.

However, in the above method, it is necessary to perform a grinding process for roughening the backside of the SiC substrate, so that the backside of the substrate is roughened. Thus, the backside may be damaged, and therefore, a crack may be generated in the substrate. An electric property and a mechanical property of the substrate may be deteriorated. Accordingly, it is requested to form the ohmic electrode without grinding the backside to form the convexity and concavity.

In view of the above points, JP-A-2007-96263 (corresponding to US 2007/0045631-A1) teaches a method for terminate the backside of the SIC substrate with a hydrogen atom or a hydroxyl group so as to easily displace an electron. The backside of the substrate provides a contact boundary with the ohmic electrode.

However, when the backside of the substrate is terminated with the hydrogen atom or the hydroxyl group as described in JP-A-2007-96263. and a sintering temperature of the ohmic electrode is equal to or higher than 800° C., the hydrogen atom and the hydroxyl group are removed from the substrate. Thus, the termination effect is disappeared, so that the ohmic property is not obtained.

SUMMARY

It is an object of the present disclosure to provide a manufacturing method of a SIC semiconductor device without performing an impurity ion implantation process and forming a convexity and concavity on a base surface of a substrate, on which an ohmic electrode is formed. The SIC semiconductor device shows an excellent termination effect, which is not disappeared in a sintering process. Further, it is another object of the present disclosure to provide a SIC semiconductor device having an ohmic electrode, which shows an excellent ohmic property.

According to a first aspect of the present disclosure, a silicon carbide semiconductor device includes: a semiconductor substrate made of silicon carbide single crystal and having a principal surface and a backside; and an ohmic electrode contacting one of the principal surface and the backside of the semiconductor substrate in an ohmic manner. A boundary between the ohmic electrode and the one of the principal surface and the backside of the semiconductor substrate is terminated with an element, which has a Pauling electronegativity larger than silicon and a binding energy with silicon larger than a binding energy of Si—H.

In the above device, the element and the one of the principal surface and the backside of the semiconductor substrate is coupled with an ion bonding manner, so that an electron on the one of the principal surface and the backside of the semiconductor substrate is localized. Thus, the number of electrons, which carries an electric charge, increases, and therefore, a displacement of the electric charge is easily performed. Thus, a contact resistance is reduced.

The binding energy between the element and the one of the principal surface and the backside of the semiconductor substrate is large, similar to a SiOx coupling. Thus, even when the substrate is annealed, the binding between the element and the one of the principal surface and the backside of the semiconductor substrate is stable. Accordingly, even if annealing temperature in a forming step of the ohmic electrode is high, a termination effect is maintained so that the reduction effect of the contact resistance is obtained.

According to a second aspect of the present disclosure, a manufacturing method of a silicon carbide semiconductor device: including a semiconductor substrate made of silicon carbide single crystal and having a principal surface and a backside; and an ohmic electrode contacting one of the principal surface and the backside of the semiconductor substrate in an ohmic manner, the manufacturing method includes: preparing the semiconductor substrate; terminating the one of the principal surface and the backside of the semiconductor substrate with an element, which has a Pauling electronegativity larger than silicon and a binding energy with silicon larger than a binding energy of Si—H; forming a metal film on the one of the principal surface and the backside of the semiconductor substrate after the terminating; and annealing the metal film so as to provide the ohmic electrode after the forming of the metal film.

In the above method, the ohmic electrode formed on the one of the principal surface and the backside of the semiconductor substrate provides an excellent ohmic property. Thus, it is not necessary to perform an impurity ion implantation process and a forming process of a convexity and concavity on the one of the principal surface and the backside of the semiconductor substrate. Further, the termination effect is not disappeared in a sintering process.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION (First Embodiment)

Figure 1:
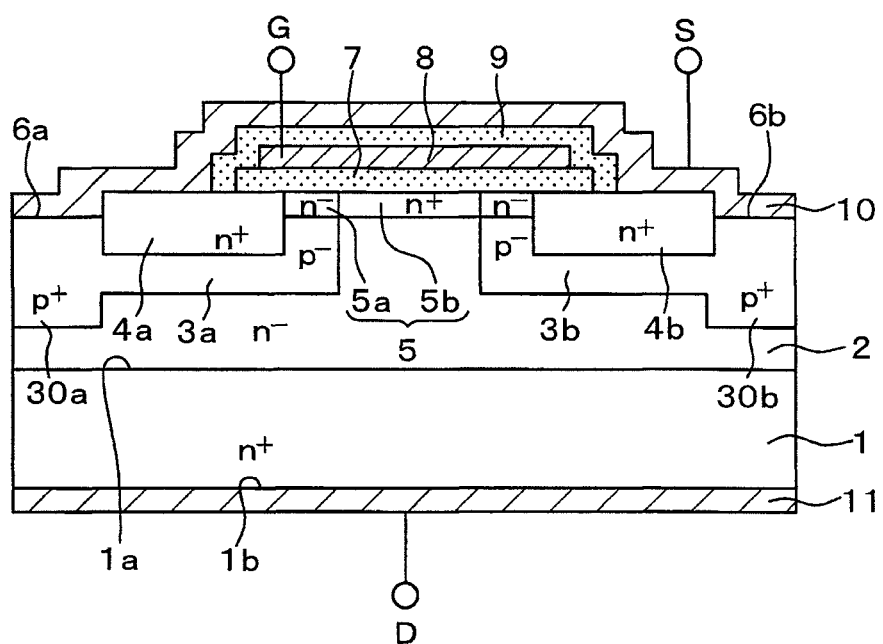
FIG. 1 is a diagram showing a cross sectional view of a vertical power MOSFET according to an example embodiment of the present disclosure.

An embodiment of the present disclosure will be explained with reference to the drawings. FIG. 1 shows a cross sectional view of a planar type MOSFET as a vertical power MOSFET, which is manufactured by a manufacturing method of a SiC semiconductor device according to an example embodiment of the present disclosure. The MOSFET is suitably used for an inverter. A structure of the vertical power MOSFET will be explained with reference to FIG. 1.

An N+ conductive type SIC substrate as an N+ conductive type substrate 1 has a principal surface 1a as a front surface and a backside 1b as a rear surface, which is opposite to the principal surface 1a. The substrate 1 is made of SiC. Further, a thickness of the substrate 1 is 350 micrometers. An N− conductive type epitaxial layer 2 as an epi-layer made of SiC is stacked on the principal surface 1a of the substrate 1. The epitaxial layer 2 has a dopant concentration, which is lower than the substrate 1.

Two P− conductive type base regions 3a, 3b are formed in a predetermined area of a surface portion of the epitaxial layer 2 such that the base regions 3a, 3b are spaced apart from each other, and each base region 3a, 3b has a predetermined depth. Further, two N+ conductive type source regions 4a, 4b are formed in a surface portion of the base regions 3a, 3b, respectively. Each base region 3a, 3b includes a deep base layer 30a, 30b having a thickness larger than other portions of the base region 3a, 3b. The deep base layer 30a, 30b does not overlap on the source region 4a, 4b. so that the deep base layer 30a, 30b is not disposed under the source region 4a, 4b. The deep base layer 30a, 30b having the large thickness in the base region 3a, 3b has an impurity concentration, which is larger than the impurity concentration of other portions of the base region 3a, 3b having the small thickness. The deep base layer 30a, 30b are not formed in the other portions of the base region 3a, 3b. Thus, avalanche break down phenomenon easily occurs.

An N conductive type SiC layer as a surface channel layer 5 is formed in a surface portion of the epitaxial layer 2 and the base regions 3a, 3b between the source regions 4a. The SIC layer includes an N− conductive type SIC layer 5a and an N+ conductive type SiC layer 5b. Specifically, the SIC layer is arranged in the surface portion of the epitaxial layer 2 and the base regions 3a, 3b so as to connect the source region 4a, 4b and the epitaxial layer 2. The SiC layer functions as a channel forming layer in a device surface portion when the device functions. The SIC layer provides a surface channel layer 5.

A dopant concentration of the N− conductive type SIC layer 5a in the surface channel layer 5 arranged over the base region 3a, 3b is low, for example, in a range between $1 \times 10^{15}$ $cm^{-3}$ and $1 \times 10^{17}$ $cm^{-3}$. Further, the dopant concentration of the N− conductive type SIC layer 5a is equal to or lower than the dopant concentration of the epitaxial layer 2 and the base regions 3a, 3b. Thus, the on-state resistance is reduced.

A concavity 6a, 6b is formed in a surface portion of the P− conductive type base region 3a, 3b at a position corresponding to the deep base layer 30a, 30b. The base region 3a, 3b is exposed on a bottom of the concavity 6a, 6b. Thus, a semiconductor substrate includes the N+ conductive type substrate 1, the N− conductive type epitaxial layer 2, the P− conductive type base region 3a, 3b. the N+ conductive type source region 4a, 4b and the like.

A gate insulation film made of silicon oxide is formed on the surface channel layer 5 and the source region 4a, 4b. Furthermore, a gate electrode 8 is formed on the gate insulation film 7. The gate electrode 8 is covered with an insulation film 9 made of silicon oxide. The source electrode 10 is formed on the insulation film 9. The source electrode 10 contacts the source region 4a, 4b and the base region 3a, 3b. A drain electrode 11 is formed on a backside 1b of the substrate 1. The drain electrode 11 provides an ohmic electrode, which contacts the backside 1b of the substrate 1 in ohmic manner.

In the present embodiment, the drain electrode 11 corresponds to the ohmic electrode. Alternatively, the source electrode may provide the ohmic electrode according to the later described manner.

Next, a manufacturing method of the vertical power MOSFET will be explained with reference to FIG. 2. A fundamental process of the manufacturing method of the vertical power MOSFET is almost similar to a conventional method. A forming process of the drain electrode 11 in the present embodiment is different from the conventional method, and therefore, the forming process of the drain electrode 11 will be explained. FIG. 2 shows the forming process of the drain electrode 11 in the vertical power MOSFET shown in FIG. 1. In FIG. 2, a device structure of the vertical power MOSFET is not shown for the sake of simplification.

First, the N+ conductive type substrate 1 is prepared such that a device is formed in a principal surface side of the substrate 1, so that the source electrode 10 and the like is formed in the principal surface side, but the drain electrode 11 is not formed on the backside of the substrate 1. Then, the backside 1b is ground and polished, so that the substrate 1 is thinned. Thus, the thickness of the substrate 1 is 350 micrometers, In this case, a step for forming the convexity and concavity on the backside 1b is not performed. Therefore, the surface roughness (Ra) is equal to or lower than 10 nanometers Then, a protection film for covering the source electrode 10 is formed on the principal surface 1a of the substrate 1. The protection film covers the source electrode 10 and the like as a surface electrode of the substrate 1. The protection film is made of resin material such as poly imide. The principal surface 1a of the substrate 1 is protected by the protection film. Then, the following steps are performed so that the drain electrode 11 is formed on the backside 1b of the substrate 1.

Figure 2A:
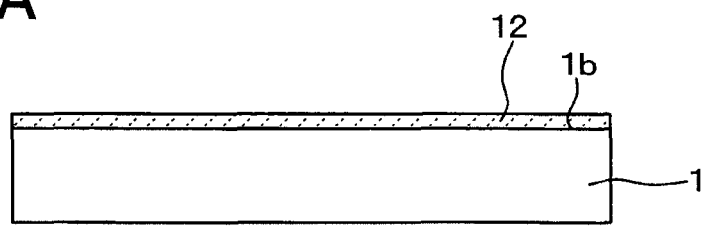
FIGS. 2A to 2D are diagrams showing a forming process of a drain electrode in the semiconductor device.

Specifically, at step in FIG. 2A, a surface processing step is formed on the backside 1b of the substrate 1 in order to terminate the backside 1b with an atom having a Pauling electronegativity larger than silicon and a binding energy with silicon larger than a binding energy of Si—H. The termination atom is, for example, fluorine (F), chlorine (Cl), oxygen (O), and nitrogen (N). The atom is ionized so that an ion plasma of the atom is generated. Then, the ion plasma is irradiated on the backside 1b of the substrate 1 so that the surface processing step is performed. Thus, a surface processing layer 12 is formed on the backside 1b of the substrate, and the atom such as halogen terminates the surface processing layer 12.

Figure 3A:
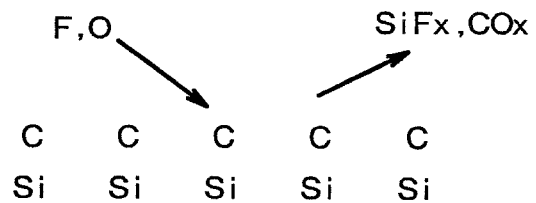
FIGS. 3A to 3B are diagrams showing a change of a molecular structure when a fluorine atom terminates a backside of an N+ conductive type substrate.
Figure 3B:
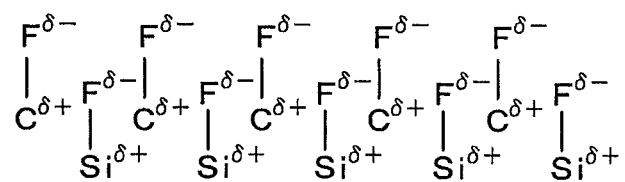
Figure 4:
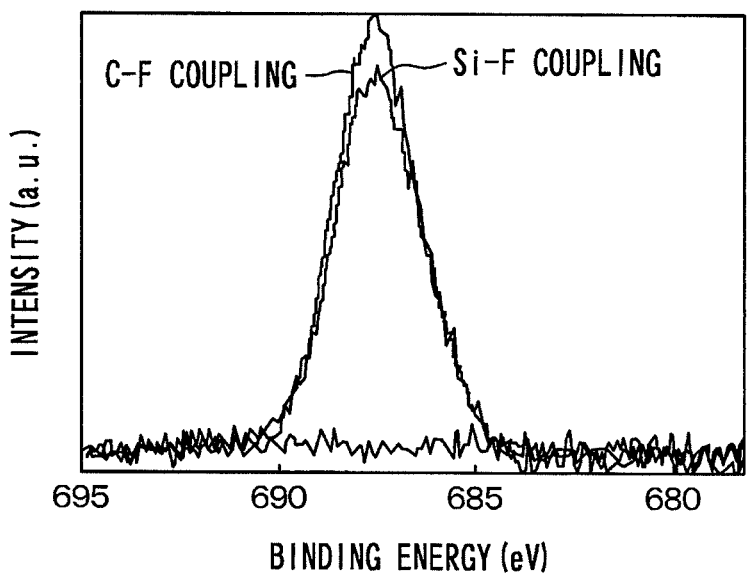
FIG. 4 is a diagram showing a XPS analysis result of the backside of the substrate when a surface processing layer is formed.
Figure 5A:
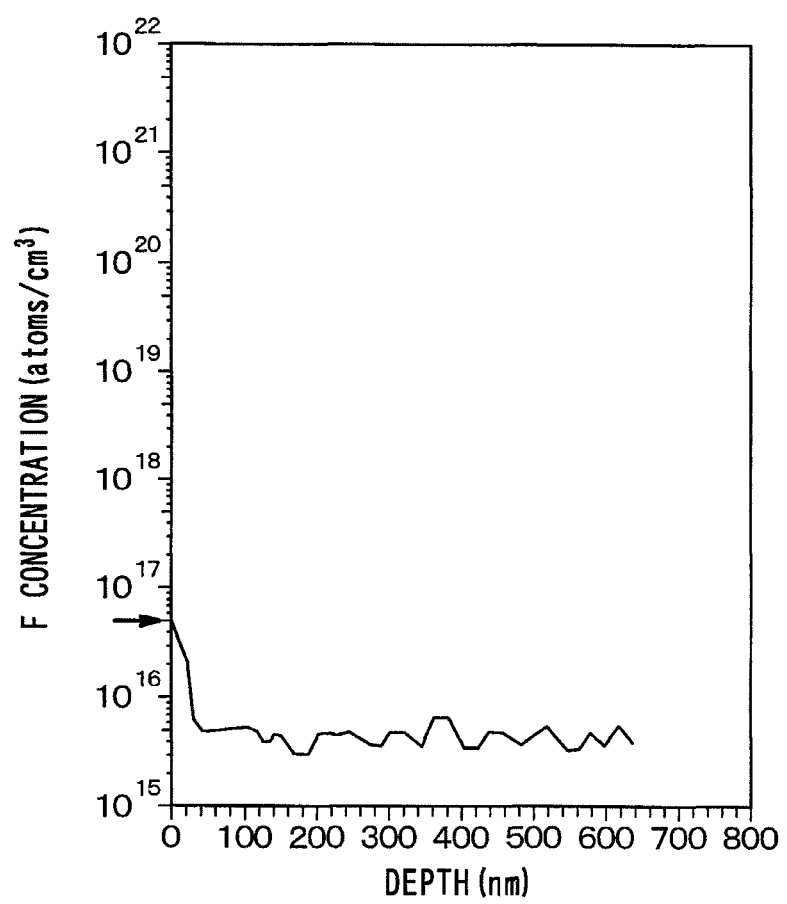
FIG. 5A is a diagram showing a fluorine concentration in a depth direction from the backside of the substrate obtained by a SIMS analysis before grinding and polishing.
Figure 5B:
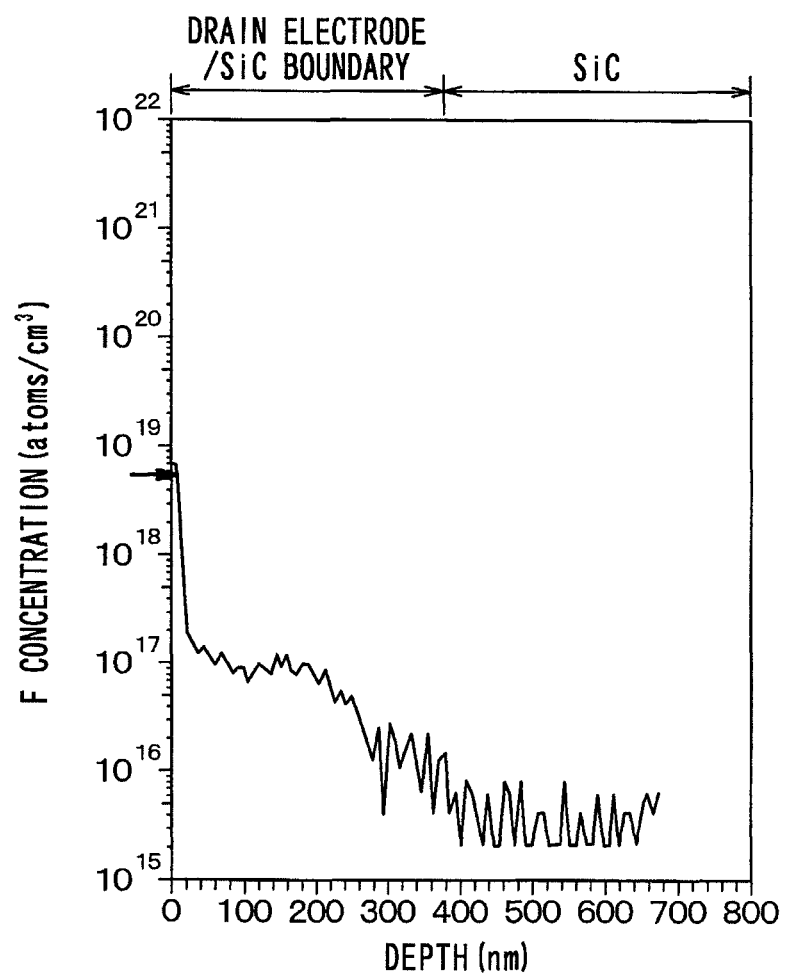
FIG. 5B is a diagram showing a fluorine concentration in a depth direction from the backside of the substrate after forming a drain electrode in a case where an etching amount is zero micrometer.
Figure 5C:
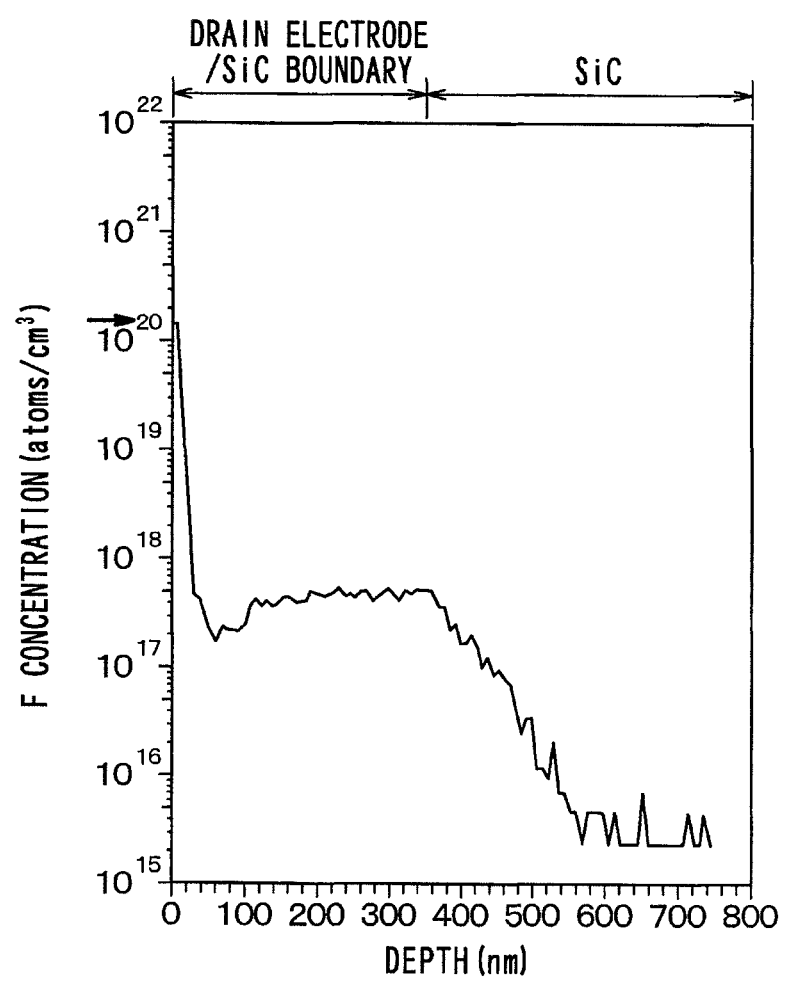
FIG. 5C is a diagram showing a fluorine concentration in a depth direction from the backside of the substrate after forming a drain electrode in a case where an etching amount is 0.3 micrometers.
Figure 5D:
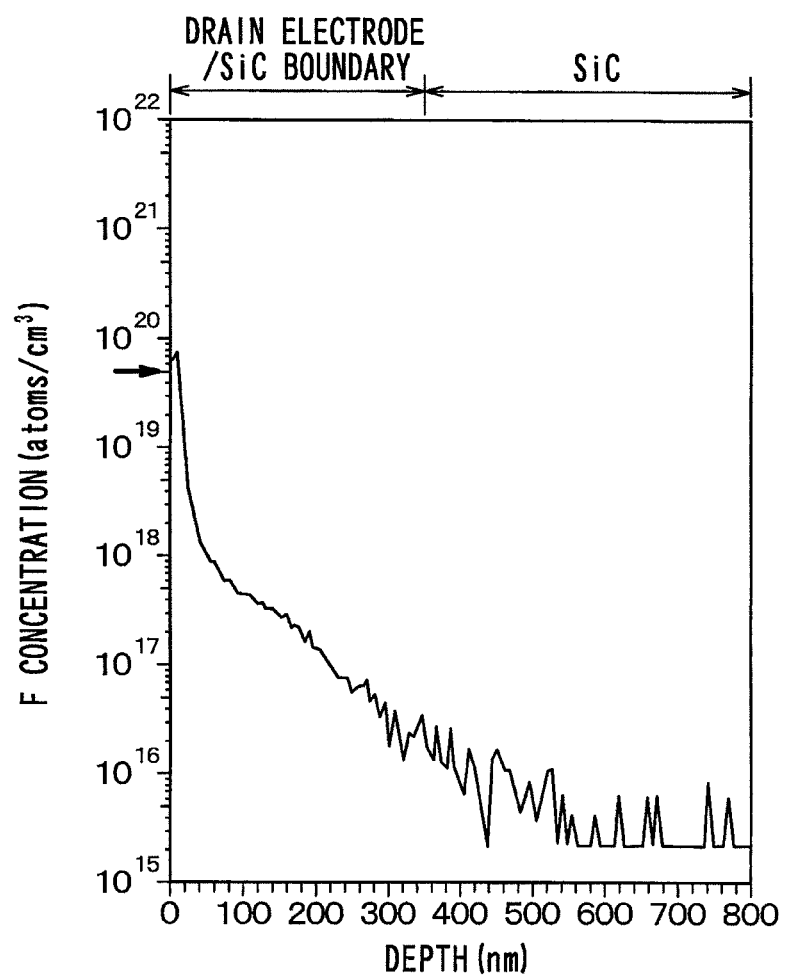
FIG. 5D is a diagram showing a fluorine concentration in a depth direction from the backside of the substrate after forming a drain electrode in a case where an etching amount is 0.5 micrometers.
Figure 5E:
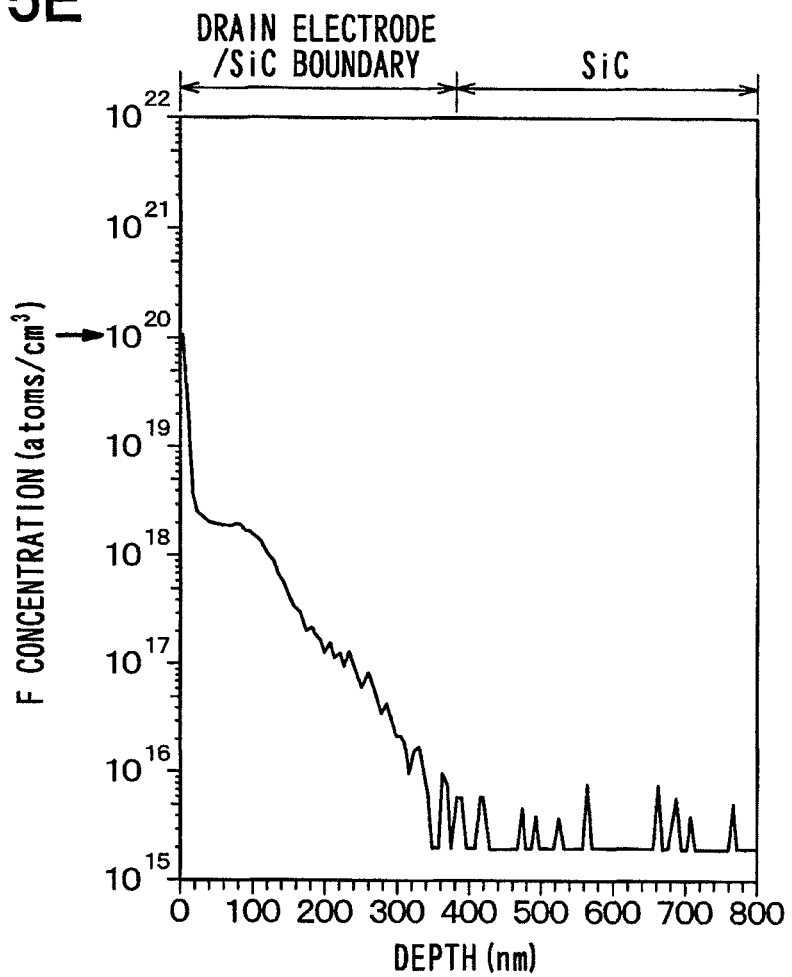
FIG. 5E is a diagram showing a fluorine concentration in a depth direction from the backside of the substrate after forming a drain electrode in a case where an etching amount is 0.7 micrometers.

For example, when the surface processing layer 12 is terminated with the fluorine, a gas of $SF_6$ or $CF_4$ together with a gas of oxygen $O_2$ is introduced into a chamber of a plasma etching apparatus. As shown in FIG. 3A, the ion plasma of a fluorine atom and an oxygen atom is generated in the chamber, and the generated ion plasma is irradiated on the backside 1b. Further, the atmospheric pressure in the chamber is adjusted, and, if necessary, an inert gas such as argon gas is introduced into the chamber. Thus, silicon atom and/or a carbon atom on the backside 1b of the substrate 1 are coupled with a fluorine atom and/or an oxygen atom, which is supplied from the ion plasma, so that the silicon atom and the carbon atom are removed as SiFx and COx from the backside 1b. Thus, as shown in FIG. 3B, a dangling bond of a silicon atom and a carbon atom are produced on a portion of the backside 1b, from which the silicon atom and the carbon atom are removed. Further, the fluorine atom in the ion plasma is trapped at the dangling bond of the silicon atom and the carbon atom, so that a coupling (i.e., Si—F) between silicon and fluorine and a coupling (i.e, C—F) between carbon and fluorine are formed. Thus, the silicon atom and the carbon atom on the backside 1b of the substrate 1 are terminated with the fluorine atom, so that the surface processing layer 12 is formed, The backside 1b of the substrate 1 is analyzed by the XPS analysis method after the surface processing layer 12 is formed. The XPS analysis result is obtained, as shown in FIG. 4. In FIG. 4, peaks derived from the Si—F coupling and the C—F coupling are observed. The plasma ion etching process is performed according to an irradiation time of the plasma ion. Regardless of existence of an etching process and an etching amount, the peaks attributed to the Si—F coupling and the C—F coupling are observed. Thus, the silicon atom and the carbon atom on the backside 1b of the substrate 1 are terminated with the fluorine atom.

Figure 2B:
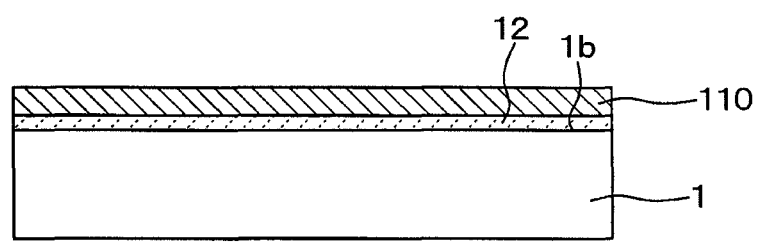

At step shown in FIG. 2B, a metal thin film forming process is performed such that a metal thin film 110 is formed on the backside 1b of the substrate 1, the surface of which is processed at step in FIG. 2A. For example, a molybdenum (Mo) element and a nickel (Ni) element are evaporated in turn on the backside 1b of the substrate 1, so that the metal thin film 110 is formed on the backside 1b. For example, the thickness of the metal thin film 110 is equal to or lager than 10 nanometers.

Figure 2C:
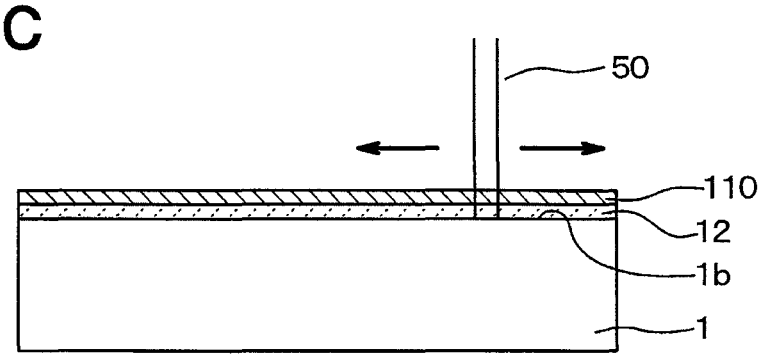
Figure 2D:
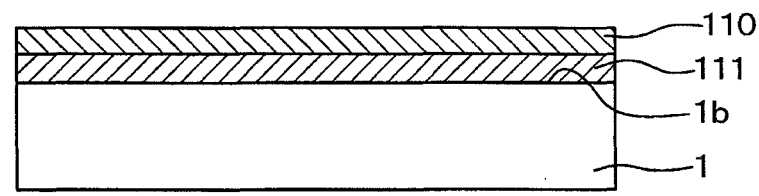

At step in FIG. 2C, the laser beam is irradiated on the metal thin film 110 so that the electrode forming process is performed. Specifically, a LD excitation laser having a fundamental wavelength of 1064 nanometers is used, and the wavelength of the laser beam is converted by a wavelength converting adapter so that a triple wave having a wavelength of 355 nanometers is generated. The laser beam 50 having the wavelength of 355 nanometers is scanned on the backside 1b of the substrate 1 so that the laser beam 50 is irradiated on the backside 1b. In this case, the laser beam 50 may be irradiated on only a part of the backside 1b, on which the metal thin film 110 is formed, by a scanning method or a masking method. According to the laser anneal process, the metal atom such as molybdenum and nickel for providing the metal thin film 110 reacts with silicon and carbon in the substrate 1 so that metal silicide such as nickel silside and metal carbide such as molybdenum carbide are generated. As shown in FIG. 2D, a low resistance metal layer 111 including the metal silicide layer and a metal carbide layer is formed.

Thus, the vertical power MOSFET in FIG. 1 is completed. According to the above process, the drain electrode 11 including the metal thin film 110 and the low resistance metal layer 111 is formed. Thus, the drain electrode 11 is formed as the ohmic electrode having the excellent ohmic property in a low temperature process without using an impurity dope layer. Although the temperature of the surface device increases more than 1000° C. in a conventional annealing process, the temperature of the surface device is equal to or lower than 100° C. in the above method according to the present embodiment.

Thus, a contact resistance between the backside 1b and the drain electrode 11 in the vertical power MOSFET manufactured in the above method is measured. Specifically, a relationship of the contact resistance between the backside 1b and the drain electrode 11 with the fluorine concentration on the backside 1b is investigated in a case where the silicon atom and the carbon atom on the backside 1b of the substrate 1 are terminated with the fluorine atom, and in a case where the silicon atom and the carbon atom on the backside 1b of the substrate 1 are not terminated with the fluorine atom. Further, the backside 1b of the substrate 1 is analyzed by the SIMS analysis method before grinding and polishing, and the backside 1b is analyzed by the SIMS analysis method after the drain electrode 11 is formed. The fluorine concentration in the substrate 1 before grinding and polishing, and a change of the fluorine concentration with respect to the etching amount of the ion plasma, i.e., the fluorine concentration in a depth direction from the backside 1b are measured. Further, the contact resistance between the backside 1b and the drain electrode 11 after the drain electrode 11 is formed is measured with respect to the fluorine concentration.

The plasma ion is generated under a generation condition such that the CF6 gas is introduced into the chamber of the plasma etching apparatus with 20 sccm, the O2 gas is introduced with 20 sccm, and the Ar gas is introduced with 50 sccm, so that the atmospheric pressure is set to be 1.5 Pa. The electricity of the power source is 800 W (watt), and the electricity of a biasing power source is 50W (watt). If the etching phenomena occur, the etching is performed under the etching condition such that the etching rate is 200 nanometers per minute, and the etching process time is set to be 1.5 minutes, 2.5 minutes or 3.5 minutes. FIGS. 5A to 5E show the results. As deeper the depth from a top surface of the backside 1b, lower the fluorine concentration, so that the fluorine concentration is reversely in proportion to the depth. Here, the fluorine concentration on the top surface is defined as the fluorine concentration on the backside 1b. According to the analysis result, the fluorine concentration in a case where the ion plasma process is performed is higher than a case where the ion plasma etching process is not performed. Further, the fluorine concentration in a case where the ion plasma etching process is performed is much higher than a case where the ion plasma etching process is not performed. The contact resistance between the backside 1b and the drain electrode 11 in a sample analyzed by the SIMS analysis method is measured.

Figure 6:
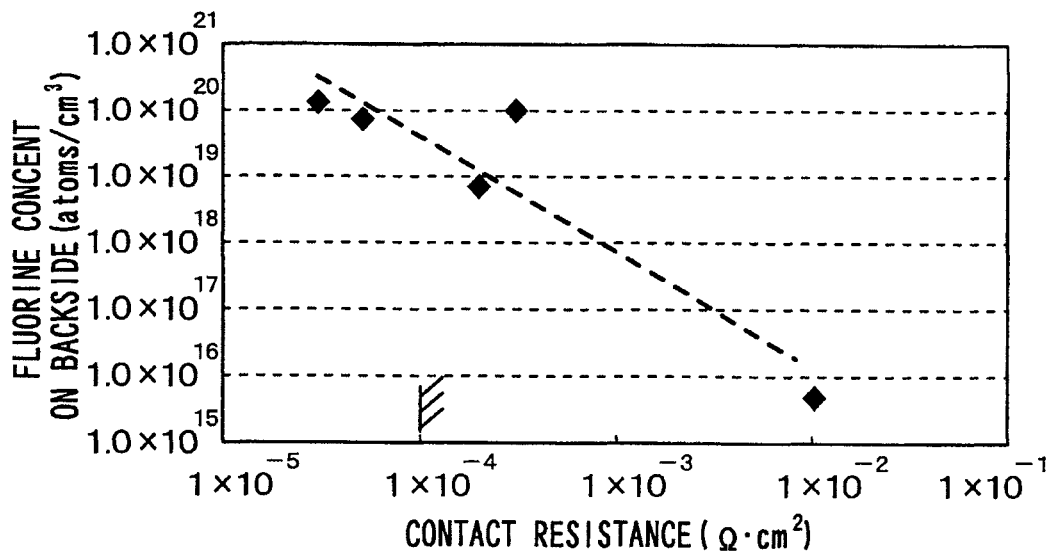
FIG. 6 is a diagram showing a change of a contact resistance between the backside of the substrate and the drain electrode with respect to a change of a fluorine concentration on the backside of the substrate.

As a result, as shown in FIG. 6, the contact resistance is small when the silicon atom and the carbon atom on the backside 1b are terminated with the fluorine atom. As higher the fluorine concentration, smaller the contact resistance, so that the contact resistance is reversely in proportion to the fluorine concentration. Specifically, when the fluorine concentration is equal to or higher than $1\times10^{19}$ atom/cm$^3$, the contact resistance is equal to or smaller than $1\times10^{-4}$ ohm·cm$^2$, so that the contact resistance is sufficiently small. In this case, the device shows the excellent ohmic property.

The electronegativity of the fluorine is 4.0. and therefore, the electronegativity of the fluorine is larger than silicon, of which the electronegativity is 1.9. Thus, the fluorine atom is coupled with the silicon atom or the carbon atom on the backside 1b with an ion bonding manner. When the fluorine atom terminates the backside 1b, an electron on the backside 1b is localized. Thus, the number of electrons that carries an electric charge becomes larger, so that the displacement of the charge is easily performed. In this case, the contact resistance becomes lower. Further, the binding energy between silicon and fluorine (i.e., Si—F) is large, similar to the binding energy between silicon and oxygen (i.e., SiOx). Thus, even if the substrate 1 is annealed, the binding between silicon and fluorine is stable. Accordingly, the binding energy of the silicon and fluorine in a case where the backside 1b is terminated with fluorine is larger than the binding energy of silicon and hydrogen (i.e., Si—H) in a case where the backside 1b is terminated with the hydrogen or the hydroxyl group according to a conventional method. Thus, even when the annealing temperature, at which the drain electrode 11 becomes the ohmic electrode, is high, the termination effect is maintained. Thus, even when the annealing temperature is high, the reduction effect of the contact resistance attributed to the termination with the fluorine atom is obtained.

Here, the backside 1b is terminated with the fluorine atom as an example of halogen in the present embodiment. Alternatively, the backside 1b may be terminated with other halogen atom such as a chlorine atom. In this case, the similar effects are obtained. When the fluorine concentration is equal to or larger than $1\times10^{19}$ atom/cm$^3$ in a case where the silicon atom and the carbon atom on the backside 1b is terminated with the fluorine atom, the contact resistance is much reduced. Here, the fluorine concentration for terminating the backside 1b is physically limited. The upper limitation of the fluorine concentration is about $1\times10^{22}$ atom/cm$^3$. Accordingly, when the fluorine concentration is in a range between $1\times10^{19}$ atom/cm$^3$ and $1\times10^{22}$ atom/cm$^3$, the device has much excellent ohmic property.

The manufacturing method of the semiconductor device includes a surface processing step for terminating the backside 1b of the substrate 1 with an element having a Pauling electronegativity larger than silicon and a binding energy with silicon larger than a binding energy of Si—H. After the surface processing step is executed, the drain electrode 11 is formed. Thus, the drain electrode 11 on the backside 1b provides the ohmic electrode having the excellent ohmic property. Accordingly, without using the impurity doped layer, and further, without forming the convexity and concavity with the surface roughness Ra equal to or larger than 10 nanometers in the grinding process, in the manufacturing method of the SIC semiconductor device, the termination effect is not disappeared in the sintering process.

In the SIC semiconductor device manufactured in the above method, the element having a Pauling electronegativity larger than silicon and a binding energy with silicon larger than a binding energy of Si—H terminates the backside 1b at the boundary between the backside 1b and the drain electrode 11. Accordingly, the drain electrode 11 formed on the backside 1b becomes the ohmic electrode having the excellent ohmic property.

(Other Embodiments)

In the above embodiment, the power MOSFET is manufactured. However, this is merely an example. Thus, the SiC semiconductor device may have other device structures such as a diode and an IGBT.

In the above embodiment, a method for terminating the backside 1b with a halogen element is performed using an ion plasma. Alternatively, the method may be performed by other ways. For example, the termination method may be performed by a laser ablation method in halogen atmosphere, an ICP (ion cluster plasma) method, an etching method or the like.

At step in FIG. 2B, the metal thin film 110 is deposited by an evaporation method. Alternatively, the metal thin film 110 may be formed by a CVD method, a coating or applying method, an electroplating method or the like.

At step in FIG. 2C, the laser beam is generated by a LD excitation laser device. Alternatively, the laser may be generated by a KrF excimer laser device, a semiconductor laser device, a YAG laser device, a gas laser device or the like.

The metal thin film 110 may be made of titanium (Ti), molybdenum (Mo), tungsten (W), tantalum (Ta) or the like, which produce a suicide and/or a carbide in addition to molybdenum and nickel. For example, when the metal thin film 110 is made of Ti, and the drain electrode 11 is formed at the steps in FIGS. 2A to 2D, the backside 1b is analyzed by an Auger analysis method. According to the Auger analysis result, it is confirmed that a titan silicide is produced. Thus, even when the metal thin film 110 is made of metallic material such as titanium other than Mo and Ni, which provides the low resistance metal layer 111 having a metal silicide layer and/or a metal carbide layer, the resistance of the drain electrode 11 is reduced.

In the above embodiment, the drain electrode 11 is formed on the backside 1b as the ohmic electrode. Alternatively, other ohmic electrodes arranged on a principal surface or a backside of a semiconductor substrate made of SiC single crystal may be manufactured by the above method according to the present embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A silicon carbide semiconductor device comprising:
a semiconductor substrate made of silicon carbide single crystal and having a principal surface and a backside; and
an ohmic electrode contacting one of the principal surface and the backside of the semiconductor substrate in an ohmic manner,
wherein carbon atoms in one of the principal surface and the backside of the silicon carbide semiconductor substrate are terminated by the carbon atoms coupling with fluorine atoms, the fluorine atoms having a Pauling electronegativity larger than silicon and a binding energy with silicon larger than a binding energy of Si—H.

2. The silicon carbide semiconductor device according to claim 1,
wherein a concentration of the fluorine atoms in the one of the principal surface and the backside of the semiconductor substrate is in a range between $1 \times 10^{19}$ atom/cm$^3$ and $1 \times 10^{22}$ atom/cm$^3$.

3. The silicon carbide semiconductor device according to claim 1,
wherein the one of the principal surface and the backside of the semiconductor substrate has a contact resistance equal to or smaller than $1 \times 10^{-4}$ ohm·cm$^2$.

4. A manufacturing method of a silicon carbide semiconductor device including a semiconductor substrate made of silicon carbide single crystal and having a principal surface and a backside, and an ohmic electrode contacting one of the principal surface and the backside of the semiconductor substrate in an ohmic manner,
the manufacturing method comprising:
preparing the semiconductor substrate;
terminating carbon atoms in one of the principal surface and the backside of the silicon carbide semiconductor substrate by coupling the carbon atoms with fluorine atoms, the fluorine atoms having a Pauling electronegativity larger than silicon and a binding energy with silicon larger than a binding energy of Si—H;
forming a metal film on the backside of the semiconductor substrate after the terminating; and
annealing the metal film and forming the ohmic electrode after the forming of the metal film.

5. The manufacturing method according to claim 4,
wherein the one of the principal surface and the backside of the semiconductor substrate after the terminating has a concentration of the fluorine atoms is in a range between $1 \times 10^{19}$ atom/cm$^3$ and $1 \times 10^{22}$ atom/cm$^3$.

6. The manufacturing method according to claim 4,
wherein the annealing of the metal film uses a laser beam.

7. The manufacturing method according to claim 4,
wherein the one of the principal surface and the backside of the semiconductor substrate after the terminating has a contact resistance equal to or smaller than $1 \times 10^{-4}$ ohm·cm$^2$.

* * * * *